US012811544B2

(12) United States Patent
Zeng et al.

(10) Patent No.: US 12,811,544 B2
(45) Date of Patent: Nov. 24, 2026

(54) SYSTEM AND METHOD FOR ENERGY EFFICIENT LINE DRIVER BOOST STAGE WITH HIGH OUTPUT SWING

(71) Applicant: Avago Technologies International Sales Pte. Limited, Singapore (SG)

(72) Inventors: Zeng Zeng, Utrecht (NL); Jan Mulder, Houten (NL); Jan Roelof Westra, Uithoorn (NL)

(73) Assignee: Avago Technologies International Sales Pte. Limited, Singapore (SG)

( * ) Notice: Subject to any disclaimer, the term of this patent is extended or adjusted under 35 U.S.C. 154(b) by 647 days.

(21) Appl. No.: 18/141,330

(22) Filed: Apr. 28, 2023

(65) Prior Publication Data

US 2024/0364267 A1 Oct. 31, 2024

(51) Int. Cl.

| | |
|---|---|
| ***H03F 1/02*** | (2006.01) |
| ***G05F 1/56*** | (2006.01) |
| ***H03F 1/32*** | (2006.01) |
| ***H03F 3/45*** | (2006.01) |
| ***H03F 3/68*** | (2006.01) |

(52) U.S. Cl.

CPC ............. *H03F 1/0205* (2013.01); *G05F 1/56* (2013.01); *H03F 1/3223* (2013.01); *H03F 3/45475* (2013.01); *H03F 3/68* (2013.01); *H03F 2200/129* (2013.01); *H03F 2203/45116* (2013.01); *H03F 2203/45528* (2013.01)

(58) Field of Classification Search

CPC ............... H03F 1/0205; H03F 3/45475; H03F 2200/129; H03F 2203/45116; H03F 2203/45528; H03F 1/3223; H03F 3/68; G05F 1/56

USPC .......................................................... 330/252

See application file for complete search history.

(56) References Cited

U.S. PATENT DOCUMENTS

2002/0121929 A1 9/2002 Gropl
2007/0210869 A1* 9/2007 Ito ....................... H03F 3/45179 330/253
2018/0191312 A1* 7/2018 Mu ...................... H04B 1/1638
(Continued)

OTHER PUBLICATIONS

Buhr Simon et al: "Low power analogue equaliser with adaptive digital tuning for fast ethernet", IET Circuits Devices and Systems, the Institution of Engineering and Technology, GB, vol. 14, No. 5, Aug. 2, 2020 (Aug. 2, 2020} , pp. 600-610, XP006091784, ISSN: 1751-858X, DOI: 10.1049/IET-CDS.2019.0370 abstract; figure 6.
(Continued)

*Primary Examiner* — Andrea Lindgren Baltzell
*Assistant Examiner* — Lance Torbjorn Bartol
(74) *Attorney, Agent, or Firm* — Foley & Lardner LLP

(57) ABSTRACT

A system may include circuitry configured to couple a first end of a first resistor to a first input terminal of a line driver, and couple a first end of a second resistor to a second input terminal of the line driver. The circuitry may be configured to receive, at a second end of the first resistor, a first signal. The circuitry may be configured to receive, at a second end of the second resistor, a second signal. The circuitry may be configured to set resistance of at least one of the first resistor or the second resistor such that the line driver outputs a predetermined range of output voltages based at least on a voltage sensed from at least one of the first signal or the second signal.

19 Claims, 7 Drawing Sheets

(56) References Cited

U.S. PATENT DOCUMENTS

| | | | | |
|---|---|---|---|---|
| 2019/0173429 | A1 | 6/2019 | Seth et al. | |
| 2024/0146263 | A1 * | 5/2024 | Yu | G09G 3/3225 |

OTHER PUBLICATIONS

Domala Narsaiah et al: "Low power flipped voltage follower current mirror with improved input output impedances", Sadhana, Springer India, New Delhi, vol. 46, No. 3, Jul. 17, 2021 (Jul. 17, 2021), XP037511070, ISSN: 0256-2499, DOI: 10.1007/S12046-021-01665-6 [retrieved on Jul. 17, 2021] abstract; figure 2.

European Search Report on non-Foley case related to U.S. Appl. No. 18/141,330 dtd Sep. 16, 2024.

* cited by examiner

500

560

SYSTEM AND METHOD FOR ENERGY EFFICIENT LINE DRIVER BOOST STAGE WITH HIGH OUTPUT SWING

FIELD OF THE DISCLOSURE

This disclosure generally relates to systems and methods for providing a line driver, and more particularly to provide a boost stage of a line driver in an energy efficient manner.

BACKGROUND

Transmitters in wired communication systems often require backward compatibility with legacy standards using relatively high transmit voltages. In modern integrated circuit (IC) technologies, with the decreasing supply voltages and stringent device reliability requirements, it becomes a major design challenge for integrated line drivers to provide high voltages in a reliable and efficient way.

BRIEF DESCRIPTION OF THE DRAWINGS

Various objects, aspects, features, and advantages of the disclosure will become more apparent and better understood by referring to the detailed description taken in conjunction with the accompanying drawings, in which like reference characters identify corresponding elements throughout. In the drawings, like reference numbers generally indicate identical, functionally similar, and/or structurally similar elements.

Figure 1:
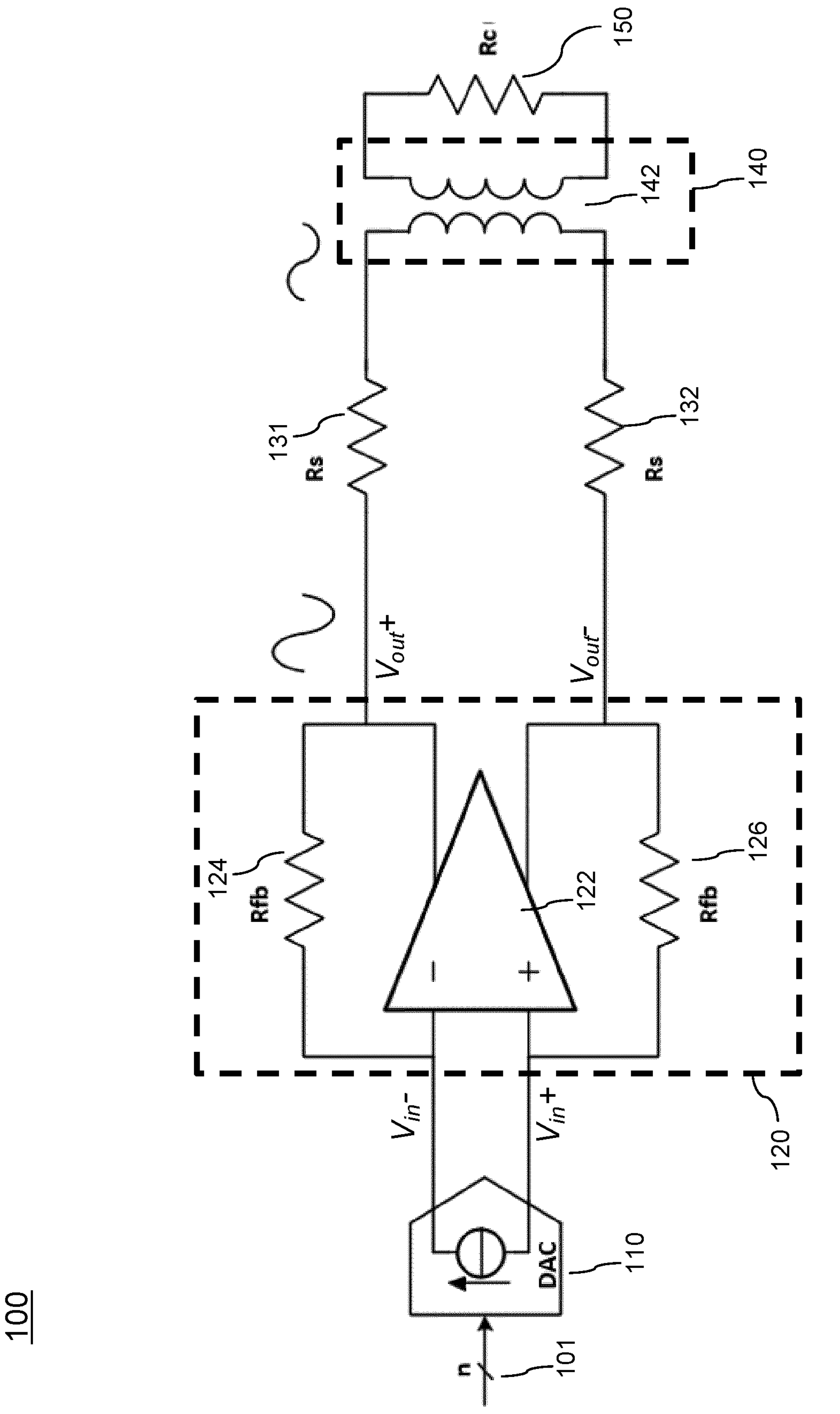
FIG. 1 is a schematic block diagram of a system including a line driver, in accordance with an embodiment.

The details of various embodiments of the methods and systems are set forth in the accompanying drawings and the description below.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Various embodiments disclosed herein are related to a system including a first amplifier and a second amplifier. Each of the first amplifier and the second amplifier may be a voltage amplifier, a current amplifier, a transimpedance amplifier, a transconductance amplifier, or any electronic device/circuit/system that can increase the power of a signal (voltage signal or current signal). In some embodiments, each of the first amplifier and the second amplifier may be a pseudo-differential amplifier. The first amplifier and a first end of a first resistor may be coupled to a first output terminal of a line driver to receive a first signal. In some embodiments, the line driver may be one or more electronic amplifiers configured to amplify input voltage signals or current signals, or any circuit that can drive a load such as a transmission line or provide/push more current through a transmission line so as to enable a longer cable length. The transmission line may be a parallel line (e.g., ladder line, twisted pair), a coaxial cable (e.g., Ethernet cable), or planar transmission lines such as stripline and microstrip, for example, or any specialized cable or other structure designed to conduct electromagnetic waves in a contained manner. The second amplifier and a first end of a second resistor may be coupled to a second output terminal of the line driver to receive a second signal. Each of the first signal and the second signal may be a voltage signal or a current signal. A second end of the second resistor and an output terminal of the first amplifier may be coupled to an interface to a physical medium (e.g., 10/100/1000BASE-T Ethernet physical media/layers). In some embodiments, an output terminal of an amplifier may be one or more connection points (e.g., conductors, ports, wires) to which the amplifier can send one or more output signals (e.g., current or voltage). In some embodiments, each of the first resistor and the second resistor may be a termination resistor or any resistor that is coupled at an end of a respective electrical transmission line coupled to the interface. In some embodiments, the interface to the physical medium may be a medium dependent interface (MDI), a medium dependent crossover interface (MDI-X), an Ethernet interface such as coaxial Ethernet, a twisted pair Ethernet, or an uplink port, or any interface from a physical layer implementation to the physical medium used to carry a signal transmission. In some embodiments, the interface may include a transformer configured to filter a common mode noise, and/or provide electrical isolation between a transmit device and the physical medium. A second end of the first resistor and an output terminal of the second amplifier may be coupled to the interface.

In some embodiments, the first amplifier may be configured to generate a first current at the second end of the second resistor, based at least on a voltage sensed (e.g., measured or detected) from the first signal, to supply the first current as an additional current to the second signal traversing the second resistor towards the interface. The second amplifier may be configured to generate a second current at the second end of the first resistor, based at least on a voltage sensed from the second signal, to supply the second current as an additional current to the first signal traversing the first resistor towards the interface. In some embodiments, each of the first amplifier and the second amplifier may be a current amplifier or a transconductance amplifier. In some embodiments, the transconductance amplifier may be an operational transconductance amplifier (OTA), a voltage controlled current source (VCCS), or any amplifier that can convert an input of voltage (e.g., differential input voltage) to an output of current such that the current is a function of the input voltage.

In some embodiments, each of the first amplifier and the second amplifier may include one or more common-gate transistors in an input stage and one or more common-gate transistors in an output stage. In some embodiments, the one or more common-gate transistors may be one or more transistors (e.g., field-effect transistor (FET) or any other types of transistors) or one or more amplifiers in which a gate terminal/electrode (or a terminal equivalent to the gate terminal depending on the type of transistors/amplifiers) is connected to a ground or a common. In some embodiments, the input stage of an amplifier may be a circuit that can sense/receive an input voltage or current signal (e.g., differential voltage signal) in the amplifier. In some embodiments, the output stage of an amplifier may be a circuit that can deliver/supply/push a certain amount of signal power into a load. In some embodiments, each of the first amplifier and the second amplifier may include a current mirror circuit configured to output a respective current in an output stage. In some embodiments, the current mirror circuit may be a circuit including a pair of matched transistors, a circuit including a Widlar current source, a Wilson current mirror circuit, or any device/circuit/system that can mirror a current through one active device (e.g., transistor) by controlling a current in another active device of the circuit. In some embodiments, at least one of the first amplifier or the second amplifier may be a class AB amplifier. In some other embodiments, at least one of the first amplifier or the second amplifier may be a class B amplifier. In some embodiments, a class A amplifier may be an amplifier in which an output current flows for the entire cycle of an input signal. In some embodiments, a class B amplifier may be an amplifier in which a collector current (or drain current) of the amplifier can flow only during a half cycle (e.g., positive half cycle) of an input signal. A class AB amplifier may be a combination of a class A amplifier and a class B amplifier in that for small power outputs the class AB amplifier operates as a class A amplifier but changes to a class B amplifier for larger current outputs.

Various embodiments disclosed herein are related to a system including a first amplifier and a first resistor coupled to an input terminal of the first amplifier. In some embodiments, an input terminal of an amplifier may be one or more connection points (e.g., conductors, ports, wires) at which the amplifier can receive one or more input signals (e.g., current or voltage). The system may include a second amplifier and a second resistor coupled to an input terminal of the second amplifier. In some embodiments, each of the first resistor and the second resistor may be a variable resistor, a programmable resistor, or any resistor whose resistance can be set a particular value in a range of resistance. A first end of the first resistor may be coupled to a first output terminal of a line driver to receive a first signal. In some embodiments, an output terminal of a line driver may be one or more connection points (e.g., conductors, ports, wires) to which the line driver can send one or more output signals (e.g., current or voltage). A first end of the second resistor may be coupled to a second output terminal of the line driver to receive a second signal. An output terminal of the second amplifier may be coupled to a first terminal of an interface to a physical medium. An output terminal of the first amplifier may be coupled to a second terminal of the interface. The first amplifier may be configured to generate a first current, based at least on a voltage sensed from the first signal and a resistance of the first resistor, to supply the first current as an additional current to the second signal traversing (or flowing) towards the interface. The second amplifier may be configured to generate a second current, based at least on a voltage sensed from the second signal and a resistance of the second resistor, to supply the second current as an additional current to the second signal traversing (or flowing) towards the interface.

In some embodiments, resistance of at least one of the first resistor or the second resistor may be set such that the first amplifier and the second amplifier output a particular range of output voltages based at least on a voltage sensed from at least one of the first signal or the second signal.

In some embodiments, each of the first amplifier and the second amplifier may be a current amplifier or a transconductance amplifier. In some embodiments, each of the first amplifier and the second amplifier may be a pseudo-differential amplifier. In some embodiments, each of the first amplifier and the second amplifier may include one or more common-gate transistors in an input stage and one or more common-gate transistors in an output stage. In some embodiments, each of the first amplifier and the second amplifier may include a current mirror circuit configured to output a respective current in an output stage. In some embodiments, at least one of the first amplifier or the second amplifier may be a class AB amplifier.

In some embodiments, a first end of a third resistor may be coupled to the first output terminal of the line driver. A first end of a fourth resistor may be coupled to the second output terminal of the line driver. A second end of the fourth resistor and the output terminal of the first amplifier may be coupled to the interface. A second end of the third resistor and the output terminal of the second amplifier may be coupled to the interface. In some embodiments, each of the third resistor and the fourth resistor may be coupled at an end of a respective transmission line coupled to the interface.

Various embodiments disclosed herein are related to a system including circuitry configured to couple a first end of a first resistor to a first input terminal of a line driver, and couple a first end of a second resistor to a second input terminal of the line driver. In some embodiments, an input terminal of a line driver may be one or more connection points (e.g., conductors, ports, wires) at which the line driver can receive one or more input signals (e.g., current or voltage). In some embodiments, the line driver may be one or more electronic amplifiers configured to amplify input voltage signals or current signals, or any circuit that can drive a load such as a transmission line or provide/push more current through a transmission line so as to enable a longer cable length. In some embodiments, the line driver may be a single fully differential amplifier. In some embodiments, the line driver may include a plurality of line drivers. The circuitry may be configured to receive, at a second end of the first resistor, a first signal. The circuitry may be configured to receive, at a second end of the second resistor, a second signal. The circuitry may be configured to set resistance of at least one of the first resistor or the second resistor such that the line driver outputs a predetermined range of output voltages based at least on a voltage sensed from at least one of the first signal or the second signal.

In some embodiments, the line driver at least one of a class AB line driver or a class B line driver. In some embodiments, the second end of the first resistor may be coupled to a first output terminal of another line driver. The second end of the second resistor may be coupled to a second output terminal of the other line driver.

In some embodiments, a first end of a third resistor and a first output terminal of the line driver are coupled to an interface to a physical medium. A first end of a fourth resistor and a second output terminal of the line driver may be coupled to the interface. A second end of the fourth resistor may be coupled to the second end of the first resistor. A second end of the third resistor may be coupled to the second end of the second resistor. In some embodiments, each of the third resistor and the fourth resistor may be coupled at an end of a respective transmission line coupled to the interface.

In some embodiments, the line driver may be configured to generate a first current, based at least on (1) a voltage sensed from at least the first signal or the second signal and (2) at least one of a resistance of the first resistor or a resistance of the second resistor, to supply the first current as an additional current to at least one of the first signal or the second signal.

Various embodiments disclosed herein are related to a method. The method includes receiving, by circuitry at a second end of a first resistor, a first signal. A first end of the first resistor may be coupled to a first input terminal of a line driver. The method may include receiving, by the circuitry at a second end of a second resistor, a second signal. A first end of the second resistor may be coupled to a second input terminal of the line driver. The method may include setting, by the circuitry at least one of the first resistor or the second resistor to cause the line driver to output a predetermined range of output voltages, based at least on a voltage sensed from at least one of the first signal or the second signal.

In some embodiments, the line driver may be one or more electronic amplifiers configured to amplify input voltage signals or current signals, or any circuit that can drive a load such as a transmission line or provide/push more current through a transmission line so as to enable a longer cable length. In some embodiments, the line driver may be a single fully differential amplifier. In some embodiments, the line driver may generate a first current, based at least on (1) a voltage sensed from at least the first signal or the second signal and (2) at least one of a resistance of the first resistor or a resistance of the second resistor, to supply the first current as an additional current to at least one of the first signal or the second signal.

In some embodiments, the line driver may be at least one of a class AB line driver or a class B line driver. In some embodiments, the second end of the first resistor may be coupled to a first output terminal of another line driver. The second end of the second resistor may be coupled to a second output terminal of the other line driver.

In some embodiments, a first end of a third resistor and the first output terminal of the line driver may be coupled to an interface to a physical medium. A first end of a fourth resistor and the second output terminal of the line driver may be coupled to the interface. A second end of the fourth resistor may be coupled to the second end of the first resistor. A second end of the third resistor may be coupled to the second end of the second resistor. In some embodiments, each of the third resistor and the fourth resistor is coupled at an end of a respective transmission line coupled to the interface.

Transmitters in wired communication systems often require backward compatibility with legacy standards using relatively high transmit voltages. In modern integrated circuit (IC) technologies, with the decreasing supply voltages and stringent device reliability requirements, it becomes a major design challenge for integrated line drivers to provide high voltages in a reliable and efficient way. For example, a line driver may not be able to provide output voltages high enough to drive a transmission line due to performance and reliability limitations. Example configurations of line drivers are shown in FIG. 1 and FIG. 2.

FIG. 1 is a schematic block diagram of a system 100 including a line driver 120, in accordance with an embodiment. The system 100 may include a digital-to-analog converter (DAC) 110, a resistor 131, a resistor 132, and an interface 140. In some embodiments, the DAC 110 may be a current output DAC or a current steering DAC which is configured to receive a digital input 101 and generate a current output signal which is a function of a value represented by the digital input 101. In some embodiments, the DAC 110 may be a voltage output DAC configured to receive a digital input 101 and generate a voltage output signal which is a function of a value represented by the digital input 101. The line driver 120 may include one or more amplifiers 122, and feedback resistors 124, 126. The line driver 120 may receive differential output signals of the DAC 110 (e.g., differential current output or differential voltage output) at input terminals thereof (e.g. $V_{in+}$ and $V_{in-}$ as shown in FIG. 1) and generate differential output signals (e.g., voltage signals or current signals) at output terminals thereof (e.g. $V_{out+}$ and $V_{out-}$ as shown in FIG. 1). In some embodiments, the one or more amplifiers 122 together with feedback resistors 124, 126 can form an amplifier, a gain of which can be set by setting resistance of feedback resistors 124, 126.

In some embodiments, a first end of the resistor 131 may be coupled to a second output terminal of the line driver 120 (e.g., $V_{out+}$), and a first end of the resistor 132 may be coupled to a first output terminal of the line driver 120 (e.g., $V_{out-}$). A second end of the resistor 132 may be coupled to an interface 140 to a physical medium (e.g., 10/100/1000BASE-T Ethernet physical media/layers) which can be represented as a load resistor 150. Similarly, a second end of the resistor 131 may be coupled to the interface 140. In some embodiments, each of the resistor 131 and the resistor 132 may be a termination resistor or any resistor that is coupled at an end of a respective electrical transmission line coupled to the interface 140. In some embodiments, the interface 140 to the physical medium may be an MDI, an MDI-X, an Ethernet interface such as coaxial Ethernet, a twisted pair Ethernet, or an uplink port, or any interface from a physical layer implementation to the physical medium used to carry a signal transmission. In some embodiments, the interface 140 may include a transformer 142 configured to filter a common mode noise, and/or provide electrical isolation between a transmit device and the physical medium. In some embodiments, the line driver 120 may be a class AB line driver which uses one or more class AB amplifiers, or a class B line driver which uses one or more class B amplifiers.

Figure 2:
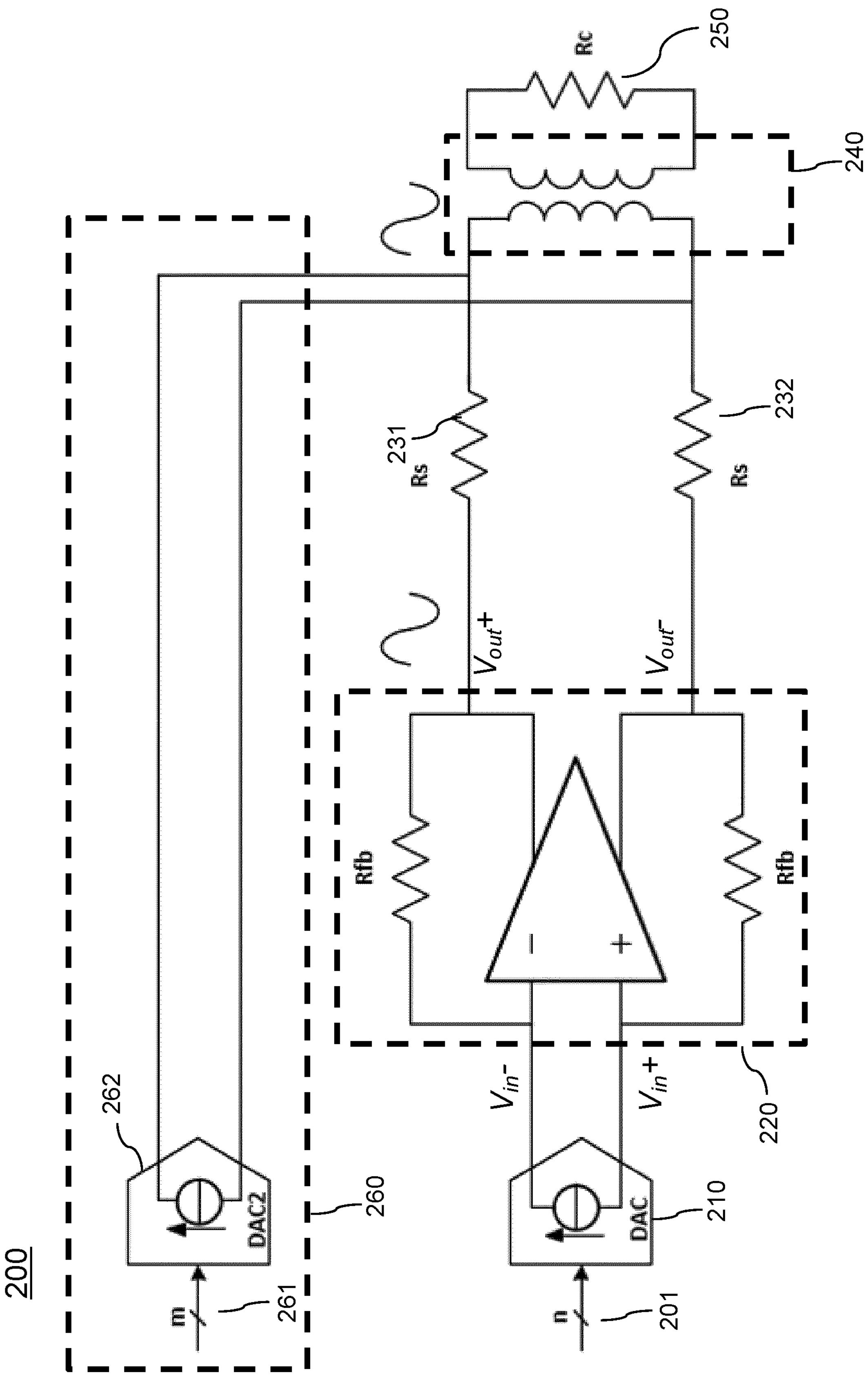
FIG. 2 is a schematic block diagram of a system including a line driver and a boost stage, in accordance with an embodiment.

FIG. 2 is a schematic block diagram of a system 200 including a line driver 220 and a boost stage 260, in accordance with an embodiment. The line driver 220 may have a configuration similar to that of the line driver 120. The system 200 may include a DAC 210, a resistor 231, a resistor 232, an interface 240, and a load resistor 250 which have similar configurations as those of the DAC 110, the resistor 131, the resistor 132, the interface 140, and the load resistor 150, respectively. In some embodiments, the boost stage 260 may include a DAC 262 which may have a configuration similar to the DAC 210. For example, the DAC 262 may be a current output DAC configured to receive a digital input 261 and generate a current output signal which is a function of a value represented by the digital input 261. Each of output terminals of the DAC 262 may be coupled between (1) an end of each of the resistors 231 and 232 and (2) the interface 240. In this manner, the DAC 262 can supply differential output signals thereof (e.g., differential current output or differential voltage output) to signals flowing towards the interface 240, thereby functioning as a boost stage 260 of the line driver 220. In some embodiments, the DAC 262 can be only enabled when a high amplitude is used. In some embodiments, the number of bits in the digital input 261 for the DAC 262 may be dependent on the linearity requirement of high amplitude applications.

As shown in FIG. 1, a current signal from the DAC 110 flows through the feedback resistors 124, 126 to generate output swing at the line driver 120, which may be limited by device reliability and linearity performance of the line driver 120. For example, the output swing at the interface 140 may be half of the output swing at the output terminals of the line driver 120 due to the impedance division of the resistance of termination resistors 131, 132 and the impedance of a cable or physical medium (e.g., the resistance of the load resistor 150), thereby causing the amplitude of transmitted signals to be limited and not enough for legacy standards.

Moreover, as shown in FIG. 2, the extra current steering DAC 262 can supply an additional current directly at the interface 240 to provide extra output swing. The extra current can be controlled by scaling the current between the DAC 210 and the DAC 262 such that the weight of the bits between the digital input 201 (of the DAC 210) and the digital input 261 (of the DAC 262) is different. However, the system 200 including the extra DAC 262 may be complex and not efficient enough when certain linearity performance and energy efficiency are required. Moreover, It is hard to match the frequency response of the path through the line driver 220 (or the transfer function from the digital input 101 to the interface 140) with the frequency response of the path through the booster stage 260 (or the transfer function from the digital input 261 to the interface 140), as the impedance at the driver output is very different from the impedance at the DAC output. Therefore, there is a need to improve a system/method for providing a boost stage of a line driver.

To solve this problem, according to certain aspects, embodiments in the present disclosure relate to an energy and area efficient technique to boost a transmit signal (e.g., output voltage/current of a main line driver) to meet high amplitude requirements, using a second/auxiliary line driver (e.g., a voltage-mode line driver or a transconductance line driver), while maintaining an acceptable performance and reliability (e.g., satisfying performance and reliability requirements). In some embodiments, an auxiliary line driver may include one or more transconductance amplifiers configured to sense/receive an output signal (e.g., voltage/current signal) of a main line driver, and supply an extra boost current directly to the output signal. In some embodiments, the auxiliary line driver may reuse the output signal of the main line driver as an input signal of the auxiliary line driver. In some embodiments, the auxiliary line driver may convert/transform an input voltage signal ($V_{in}$) received from the main line driver, into an output current signal ($I_{out}$).

In some embodiments, the auxiliary line driver may include one or more class AB line drivers or one or more class AB amplifiers. In some embodiments, the auxiliary line driver may include one or more class B line drivers or one or more class B amplifiers. In some embodiments, a type of the auxiliary line driver may be independent of a type of the main line driver. For example, the main line driver may include two-stage amplifiers (e.g., a cascade of two amplifiers), while the auxiliary line driver may include a single stage amplifier, thereby providing an improved frequency response.

In some embodiments, an auxiliary line driver may include a first resistor coupled to a first amplifier, and a second resistor coupled to a second amplifier. Each of the first amplifier and the second amplifier may include common-gate transistors in an input stage to generate a current signal. Each of the first amplifier and the second amplifier may include a current mirror circuit in an output stage to provide high output swing. In some embodiments, each of the first resistor and the second resistor may be a programmable resistor or a variable resistor. Each of the first resistor and the second resistor may be set or programmed to have different resistance values to accommodate for different output swing requirements for different applications. For example, a less resistance value of each of the first resistor and the second resistor may be set or programmed to provide higher output swing (to satisfy higher output swing requirements). In some embodiments, each of the first resistor and the second resistor may be set or programmed to have the same resistance value. In some embodiments, the auxiliary line driver may be disabled when a high output amplitude is not required for power savings.

In some embodiments, each of the first amplifier and the second amplifier may include a current amplifier or a transconductance amplifier. In some embodiments, the auxiliary line driver may convert, via the first resistor, an input voltage (e.g., $V_{in+}$) into an input current (e.g., $I_{in\_1}$) for the first amplifier to receive the input current and generate an amplified output current (e.g., $I_{out\_1}$). Similarly, the auxiliary line driver may convert, via the second resistor, an input voltage (e.g., $V_{in+}$) into an input current ($I_{in\_2}$) for the second amplifier to receive the input current and generate an amplified output current ($I_{out\_2}$). In some embodiments, the auxiliary line driver as a transconductance line driver may be configured to implement $V_{in}$-to-$I_{out}$ transconductance. In this manner, the auxiliary (transconductance) line driver may be configured to sense/receive an output voltage signal of the main line driver as an input voltage signal ($V_{in}$), generate an extra boost current ($I_{out}$) based on the input voltage signal, and supply the extra boost current directly to the interface.

Embodiments in the present disclosure have at least the following advantages and benefits. First, embodiments in the present disclosure can provide useful techniques for re-using the signal information from an output of a (main) line driver, thereby implementing an auxiliary/additional line driver in a simple and efficient manner. With the simple implementation, the auxiliary line driver can achieve a better linearity with higher output swing, compared with other implementations (e.g., addition of an extra current steering DAC; see FIG. 2).

Second, embodiments in the present disclosure can provide useful techniques for re-using a main line driver such that addition of an auxiliary line driver can easily achieve impedance matching between the combined line driver and a low impedance physical medium (e.g., a low impedance coaxial cable). In this manner, the addition of the auxiliary line driver can provide a boost stage of a line driver with better energy efficiency (e.g., low power consumption), less noise/distortions, and/or better area efficiency (e.g., occupying less area), compared with other implementations (e.g., addition of an extra current steering DAC; see FIG. 2).

Third, embodiments in the present disclosure can provide useful techniques for re-using a main line driver such the auxiliary line driver can easily achieve a frequency transfer function matched with the frequency transfer function of the main line driver (e.g., a first-order low pass filter of the main line driver).

Figure 3:
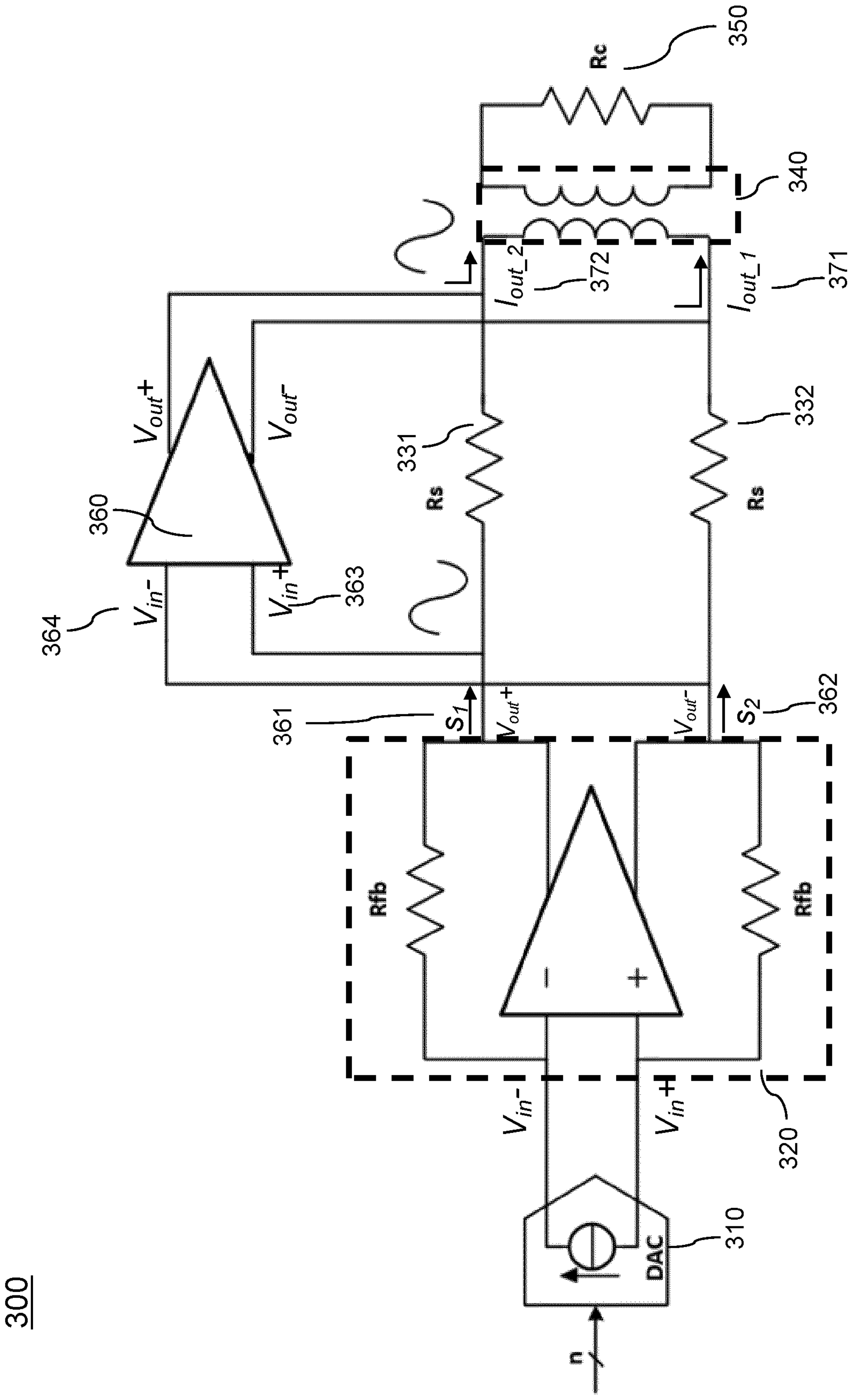
FIG. 3 is a schematic block diagram of a system including a line driver and an auxiliary line driver as a boost stage, in accordance with an embodiment.

FIG. 3 is a schematic block diagram of a system 300 including a main line driver 320 and an auxiliary line driver 360 as a boost stage, in accordance with an embodiment. The line driver 320 may have a configuration similar to that of the line driver 120 (see FIG. 1). The system 300 may include a DAC 310, a resistor 331, a resistor 332, an interface 340, and a load resistor 350 which have similar configurations as those of the DAC 110, the resistor 131, the resistor 132, the interface 140, and the load resistor 150, respectively (see FIG. 1).

In some embodiments, the system 300 may boost a transmit signal (e.g., output voltage/current of the main line driver 320) to meet high amplitude requirements, using the auxiliary line driver 360 (e.g., a voltage-mode line driver or a transconductance line driver), while maintaining an acceptable performance and reliability (e.g., satisfying performance and reliability requirements). In some embodiments, the auxiliary line driver 360 may include one or more amplifiers (not shown) configured to sense/receive an output signal 361 (e.g., voltage/current signal $S_1$) of the main line driver 320 at a first input terminal 363 ($V_{in+}$), and supply an extra boost current 371 ($I_{out\_1}$) directly to the output signal $S_2$ traversing the resistor 332. The one or more amplifier may include a voltage amplifier, a current amplifier, a transimpedance amplifier, a transconductance amplifier, or any electronic device/circuit/system that can increase the power of a signal (voltage signal or current signal). In some embodiments, the auxiliary line driver 360 may be a single fully differential amplifier. The auxiliary line driver 360 may be configured to sense/receive an output signal 362 (e.g., voltage/current signal $S_2$) of the main line driver 320 at a second input terminal 364 ($V_{in-}$), and supply an extra boost current 372 ($I_{out\_2}$) directly to the output signal $S_1$ traversing the resistor 331. In some embodiments, the auxiliary line driver 360 may reuse the output signal $S_1$, $S_2$ of the main line driver 320 as an input signal of the auxiliary line driver. In some embodiments, the auxiliary line driver 360 may convert/transform an input voltage signal ($S_1$, $S_2$) received from the main line driver, into an output current signal ($I_{out\_1}$, $I_{out\_2}$).

In some embodiments, the auxiliary line driver 360 may include one or more class AB line drivers or one or more class AB amplifiers. In some embodiments, the auxiliary line driver 360 may include one or more class B line drivers or one or more class B amplifiers. In some embodiments, a type of the auxiliary line driver 360 may be independent of a type of the main line driver 320. For example, the main line driver 320 may include two-stage amplifiers (e.g., a cascade of two amplifiers), while the auxiliary line driver 360 may include a single stage amplifier, thereby providing an improved frequency response.

Figure 4:
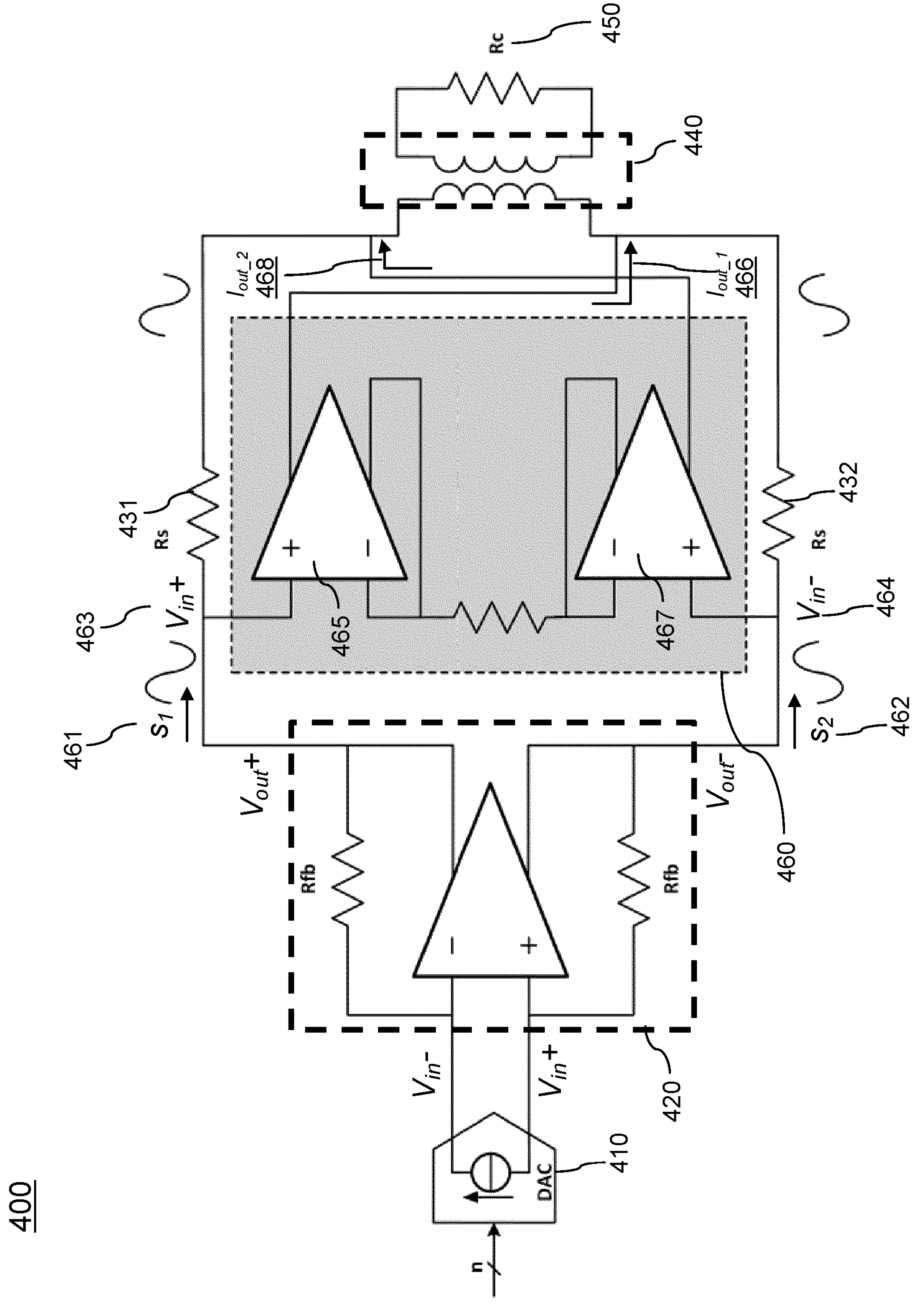
FIG. 4 is a schematic block diagram of a system including a line driver and a transconductance line driver as a boost stage, in accordance with an embodiment.

FIG. 4 is a schematic block diagram of a system 400 including a line driver 420 and an auxiliary (transconductance) line driver 460 as a boost stage, in accordance with an embodiment. The line driver 420 may have a configuration similar to that of the line driver 120 (see FIG. 1). The system 400 may include a DAC 410, a resistor 431, a resistor 432, an interface 440, and a load resistor 450 which have similar configurations as those of the DAC 110, the resistor 131, the resistor 132, the interface 140, and the load resistor 150, respectively (see FIG. 1).

In some embodiments, the auxiliary line driver 460 may include a first amplifier 465 configured to sense/receive an output signal 461 (e.g., voltage/current signal $S_1$) of the main line driver 420 at a first input terminal 463 ($V_{in+}$), and supply an extra boost current 466 ($I_{out\_1}$) directly to the output signal $S_2$ traversing the resistor 432. Similarly, the auxiliary line driver 460 may include a second amplifier 467 configured to sense/receive an output signal 462 (e.g., voltage/current signal $S_2$) of the main line driver 420 at a second input terminal 464 ($V_{in-}$), and supply an extra boost current 468 ($I_{out\_2}$) directly to the output signal $S_1$ traversing the resistor 431. In some embodiments, each of the first amplifier 465 and the second amplifier 467 may be a pseudo-differential amplifier. In some embodiments, each of the first amplifier 465 and the second amplifier 467 may be a current amplifier or a transconductance amplifier. In some embodiments, the transconductance amplifier may be an operational transconductance amplifier (OTA), a voltage controlled current source (VCCS), or any amplifier that can converts an input of voltage (e.g., differential input voltage) to an output of current such that the current is a function of the input voltage. In some embodiments, the auxiliary line driver 460 may reuse the output signal ($S_1$, $S_2$) of the main line driver 420 as an input signal of the auxiliary line driver. In some embodiments, the auxiliary line driver 460 may convert/transform an input voltage signal ($S_1$, $S_2$) received from the main line driver, into an output current signal ($I_{out\_1}$, $I_{out\_2}$).

In some embodiments, the auxiliary line driver 460 may include one or more class AB line drivers or one or more class AB amplifiers. In some embodiments, the auxiliary line driver 460 may include one or more class B line drivers or one or more class B amplifiers. In some embodiments, a type of the auxiliary line driver 460 may be independent of a type of the main line driver 420. For example, the main line driver 420 may include two-stage amplifiers (e.g., a cascade of two amplifiers), while the auxiliary line driver 460 may include a single stage amplifier, thereby providing an improved frequency response.

In some embodiments, the first amplifier 465 and a first end of the first resistor 431 (e.g., left end of the first resistor 431 in FIG. 4) may be coupled to a first output terminal ($V_{out+}$) of the main line driver 420 to receive a first signal 461 ($S_1$). The second amplifier 467 and a first end of the second resistor 432 (e.g., left end of the second resistor 432 in FIG. 4) may be coupled to a second output terminal ($V_{out-}$) of the main line driver 420 to receive a second signal 462 ($S_2$). Each of the first signal 461 ($S_1$) and the second signal 462 ($S_2$) may be a voltage signal or a current signal. A second end of the second resistor 432 (e.g., right end of the second resistor 432 in FIG. 4) and an output terminal of the first amplifier 465 may be coupled to the interface 440. A second end of the first resistor (e.g., right end of the first resistor 431 in FIG. 4) and an output terminal of the second amplifier 467 may be coupled to the interface. In some embodiments, the first amplifier 465 may be configured to generate a current 466 ($I_{out\_1}$) at the second end of the second resistor 432, based at least on a voltage sensed from the first signal 461 ($S_1$), to supply an additional current to the second signal 462 ($S_2$) traversing the second resistor 432 towards the interface 440. The second amplifier 467 may be configured to generate a current 468 ($I_{out\_2}$) at the second end of the first resistor 431, based at least on a voltage sensed from the second signal, to supply an additional current to the first signal 461 ($S_1$) traversing the first resistor 431 towards the interface 440.

Figure 5A:
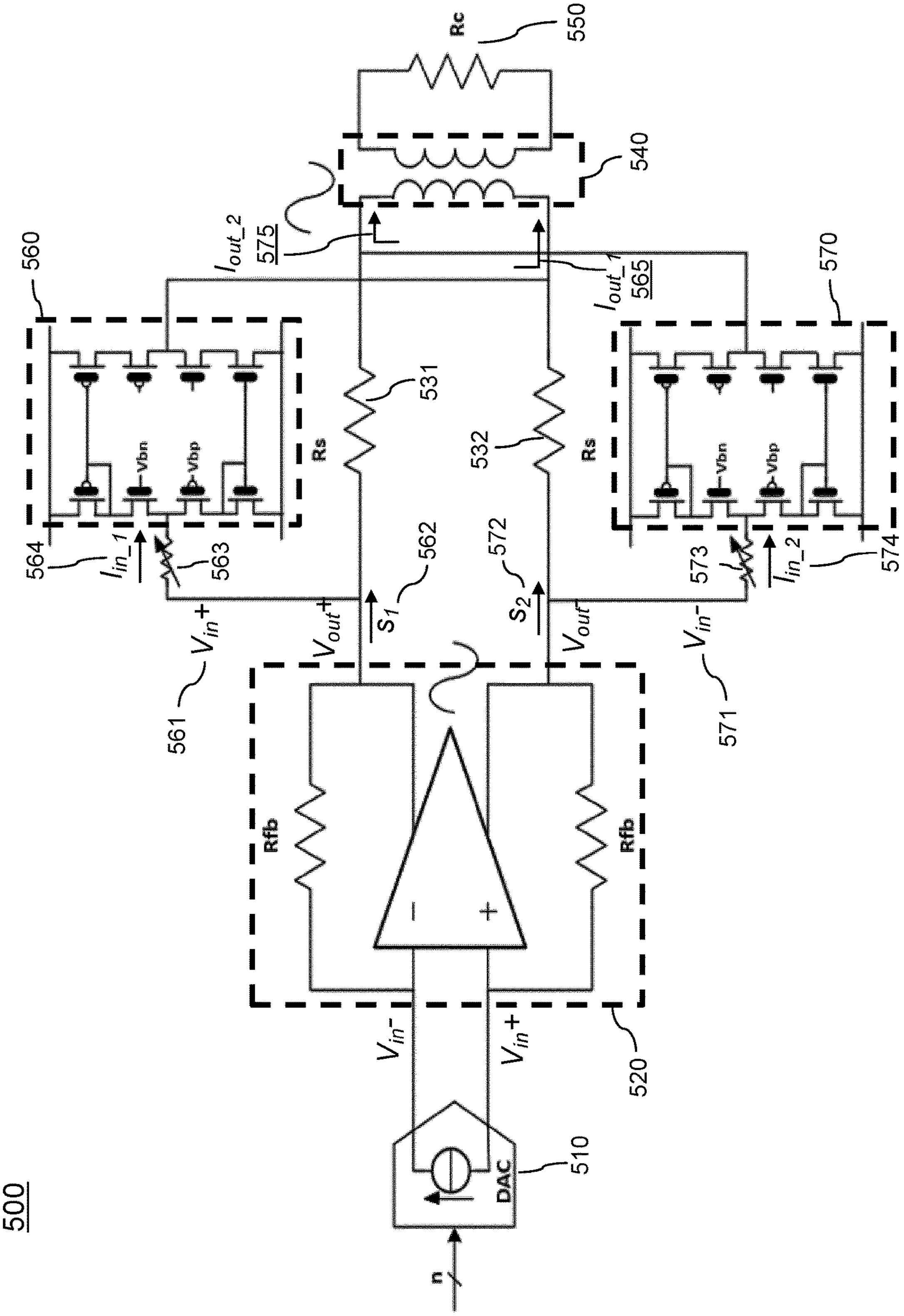
FIG. 5A and FIG. 5B are schematic block diagrams of a system including a line driver and a transconductance line driver as a boost stage, in accordance with an embodiment.
Figure 5B:
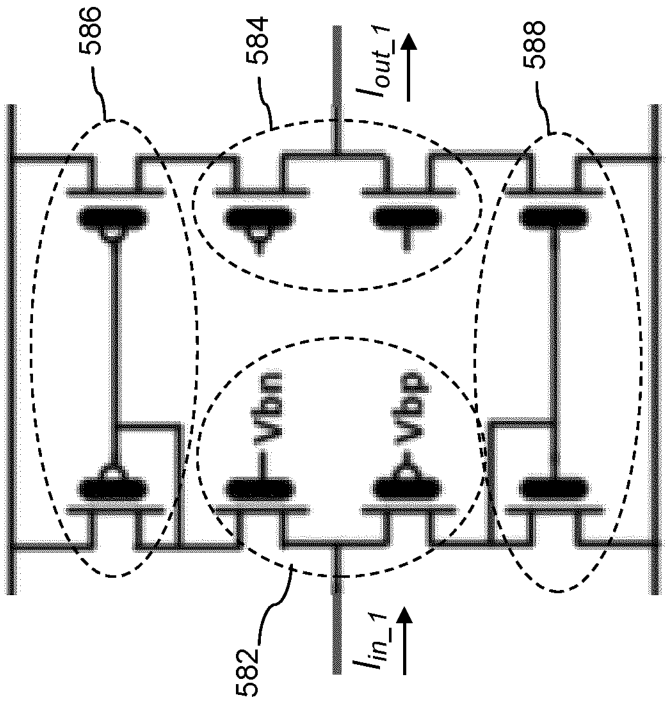

FIG. 5A and FIG. 5B are schematic block diagrams of a system 500 including a main line driver 520 and an auxiliary (transconductance) line driver (which includes a first transconductance amplifier 560 and a second transconductance amplifier 570) as a boost stage, in accordance with an embodiment. The line driver 520 may have a configuration similar to that of the line driver 120 (see FIG. 1). The system 500 may include a DAC 510, a resistor 531, a resistor 532, an interface 540, and a load resistor 550 which have similar configurations as those of the DAC 110, the resistor 131, the resistor 132, the interface 140, and the load resistor 150, respectively (see FIG. 1).

In some embodiments, the auxiliary line driver may include a first resistor 563 coupled to a first amplifier 560, and a second resistor 573 coupled to a second amplifier 570. In some embodiments, each of the first amplifier 560 and the second amplifier 570 may be a current amplifier or a transconductance amplifier. In some embodiments, each of the first amplifier 560 and the second amplifier 570 may be a pseudo-differential amplifier. In some embodiments, each of the first resistor 563 and the second resistor 573 may be a programmable resistor or a variable resistor. Each of the first resistor 563 and the second resistor 573 may be set or programmed to have different resistance values to accommodate for different output swing requirements for different applications. For example, a less resistance value of each of the first resistor 563 and the second resistor 573 may be set or programmed to provide higher output swing (to satisfy higher output swing requirements). In some embodiments, each of the first resistor 563 and the second resistor 573 may be set or programmed to have the same resistance value. In some embodiments, the auxiliary line driver may be disabled when a high output amplitude is not required for power savings.

In some embodiments, the auxiliary line driver may convert, via the first resistor 563, an input voltage of a first signal 562 ($S_1$) received at a first input terminal 561 ($V_{in+}$) into an input current 564 (e.g., $I_{in\_1}$) for the first amplifier 560 to receive the input current 564 and generate an amplified output current 565 ($I_{out\_1}$). Similarly, the auxiliary line driver may convert, via the second resistor 573, an input voltage of a second signal 572 ($S_2$) received at a second input terminal 571 ($V_{in-}$) into an input current 574 (e.g., $I_{in\_2}$) for the second amplifier 570 to receive the input current 574 and generate an amplified output current 575 ($I_{out\_2}$). In some embodiments, the auxiliary line driver as a transconductance line driver may be configured to implement $V_{in}$-to-$I_{out}$ transconductance. In this manner, the auxiliary (transconductance) line driver may be configured to sense/receive an output voltage signal ($S_2$, $S_2$) of the main line driver 520 as an input voltage signal ($V_{in}$), generate an extra boost current ($I_{out\_1}$, $I_{out\_2}$) based on the input voltage signal ($S_2$, $S_2$), and supply the extra boost current ($I_{out\_1}$, $I_{out\_2}$) directly to the interface 540.

Referring to FIG. 5A and FIG. 5B, the first amplifier 560 may include one or more common-gate transistors 582 in an input stage and one or more common-gate transistors 584 in an output stage. In some embodiments, the one or more common-gate transistors 582, 584 may be one or more transistors (e.g., field-effect transistor (FET) or any other types of transistors) or one or more amplifiers in which a gate terminal/electrode (or a terminal equivalent to the gate terminal depending on the type of transistors/amplifiers) is connected to a ground or a common. In some embodiments, the input stage of an amplifier may be a circuit that can sense/receive an input voltage or current signal (e.g., differential voltage signal) in the amplifier. In some embodiments, the output stage of an amplifier may be a circuit that deliver/supply/push a certain amount of signal power into a load. In some embodiments, the one or more common-gate transistors 582, 584 may include a pMOS transistor whose gate is biased with a pMOS transistor gate bias voltage Vbp, and an nMOS transistor whose gate is biased with an nMOS transistor gate bias voltage Vbn. In some embodiments, the pMOS transistor gate bias voltage Vbp may be a fixed voltage lower than a high potential supply voltage Vdd by a prescribed voltage, while the nMOS transistor gate bias voltage Von may be a fixed voltage higher than the low potential supply voltage Vss by a prescribed voltage. In some embodiments, the first amplifier 560 may include a current mirror circuit 586 (e.g., PMOS current mirror) configured to output a current in an output stage. In some embodiments, the first amplifier 560 may include a current mirror circuit 588 (e.g., NMOS current mirror) configured to output a current in the output stage. In some embodiments, the current mirror circuit may be a circuit including a pair of matched transistors (as shown in FIG. 5B), a circuit including a Widlar current source, a Wilson current mirror circuit, or any device/circuit/system that can mirror a current through one active device (e.g., transistor) by controlling a current in another active device of the circuit. In some embodiments, the gain of the current mirror is greater than one. The second amplifier 570 may have a configuration similar to the first amplifier 560. In some embodiments, at least one of the first amplifier 560 or the second amplifier 570 may be a class AB amplifier. In some other embodiments, at least one of the first amplifier 560 or the second amplifier 570 may be a class B amplifier.

Referring to FIG. 5A, in some embodiments, a system (e.g., system 500) may include a first amplifier 560 and a first resistor 563 coupled to an input terminal of the first amplifier 560. The system 500 may include a second amplifier 570 and a second resistor 573 coupled to an input terminal of the second amplifier 570. In some embodiments, each of the first resistor 563 and the second resistor 573 may be a variable resistor, a programmable resistor, or any resistor whose resistance can be set a particular value in a range of resistance. A first end of the first resistor 563 (e.g., left end of the first resistor 563 in FIG. 5A) may be coupled to a first output terminal ($V_{out+}$) of the main line driver 520 to receive a first signal 562 ($S_1$). A first end of the second resistor 573 (e.g., left end of the second resistor 573 in FIG. 5A) may be coupled to a second output terminal ($V_{out-}$) of the main line driver 520 to receive a second signal 572 ($S_2$). An output terminal of the second amplifier 570 may be coupled to a first terminal 541 of the interface 540. An output terminal of the first amplifier 560 may be coupled to a second terminal 542 of the interface 540. The first amplifier 560 may be configured to generate a current 565 ($I_{out\_1}$), based at least on a voltage sensed from the first signal 562 ($S_1$) and a resistance of the first resistor 563, to supply an additional current to the second signal 572 ($S_2$) traversing (or flowing) towards the interface 540. The second amplifier 570 may be configured to generate a current 575 ($I_{out\_2}$), based at least on a voltage sensed from the second signal 572 ($S_2$) and a resistance of the second resistor 573, to supply an additional current to the second signal 572 ($S_2$) traversing (or flowing) towards the interface 540. In some embodiments, at least one of the first resistor 563 or the second resistor 573 may be set (e.g., a resistance value of at least one of the first resistor 563 or the second resistor 573 is set) to cause the first amplifier 560 and the second amplifier 570 to output a particular range of output voltages, based at least on a voltage sensed from at least one of the first signal 562 ($S_1$) or the second signal 572 ($S_2$).

In some embodiments, a first end of a third resistor (e.g., left end of termination resistor 531) may be coupled to a first output terminal (e.g., $V_{out+}$) of the main line driver 520. A first end of a fourth resistor (e.g., left end of termination resistor 532) may be coupled to a second output terminal (e.g., $V_{out-}$) of the main line driver 520. A second end of the fourth resistor (e.g., right end of termination resistor 532) and the output terminal of the first amplifier 560 may be coupled to the interface (e.g., the second terminal 542 of the interface 540). A second end of the third resistor (e.g., right end of termination resistor 531) and the output terminal of the second amplifier 570 may be coupled to the interface (e.g., the first terminal 541 of the interface 540). In some embodiments, each of the third resistor (e.g., termination resistor 531) and the fourth resistor (e.g., termination resistor 532) may be coupled at an end of a respective transmission line coupled to the interface 540.

Referring to FIG. 5A, in some embodiment, a system (e.g., system 500) may include circuitry (e.g., circuitry of an auxiliary line driver including resistors 563, 573, amplifiers 560, 570) configured to couple a first end of a first resistor (e.g., right end of first resistor 563) to a first input terminal 561 ($V_{in+}$) of the auxiliary line driver, and couple a first end of a second resistor (e.g., right end of second resistor 573) to a second input terminal 571 ($V_{in-}$) of the auxiliary line driver. In some embodiments, the auxiliary line driver may be one or more electronic amplifiers configured to amplify input voltage signals or current signals, or any circuit that can drive a load such as a transmission line or provide/push more current through a transmission line so as to enable a longer cable length. In some embodiments, the auxiliary line driver may include a plurality of line drivers. The circuitry may be configured to receive, at a second end of the first resistor (e.g., left end of first resistor 563), a first signal 562 ($S_1$). The circuitry may be configured to receive, at a second end of the second resistor (e.g., left end of second resistor 573), a second signal 572 ($S_2$). The circuitry may be configured to set resistance of at least one of the first resistor 563 or the second resistor 573 such that the auxiliary line driver outputs a predetermined range of output voltages based at least on a voltage sensed from at least one of the first signal 562 ($S_1$) or the second signal 572 ($S_2$). In some embodiments, the line driver may include at least one of a class AB line driver or a class B line driver. In some embodiments, the second end of the first resistor (e.g., left end of first resistor 563) may be coupled to a first output terminal of another line driver (e.g., first output terminal $V_{out+}$ of the main line driver 520). The second end of the second resistor (e.g., left end of second resistor 573) may be coupled to a second output terminal of the other line driver (e.g., first output terminal $V_{out+}$ of the main line driver 520).

In some embodiments, a first end of a third resistor (e.g., right end of termination resistor 532) and a first output terminal of the auxiliary line driver (e.g., output terminal of the first amplifier 560) may be coupled to the interface 540 (e.g., the second terminal 542 of the interface 540). A first end of a fourth resistor (e.g., right end of termination resistor 531) and a second output terminal of the auxiliary line driver (e.g., output terminal of the second amplifier 570) may be coupled to the interface 540 (e.g., the first terminal 541 of the interface 540). A second end of the fourth resistor (e.g., left end of termination resistor 531) may be coupled to the second end of the first resistor (e.g., left end of first resistor 563). A second end of the third resistor (e.g., left end of termination resistor 532) may be coupled to the second end of the second resistor (e.g., left end of first resistor 573). In some embodiments, each of the third resistor 532 and the fourth resistor 531 may be coupled at an end of a respective transmission line coupled to the interface 540. In some embodiments, the auxiliary line driver may be configured to generate a current (e.g., current 565 ($I_{out\_1}$), current 575 ($I_{out\_2}$)), based at least on (1) a voltage sensed from at least the first signal 562 ($S_1$) or the second signal 572 ($S_2$) and (2) at least one of a resistance of the first resistor 563 or a resistance of the second resistor 573, to supply an additional current to at least one of the first signal 562 ($S_1$) or the second signal 572 ($S_2$).

Figure 6:
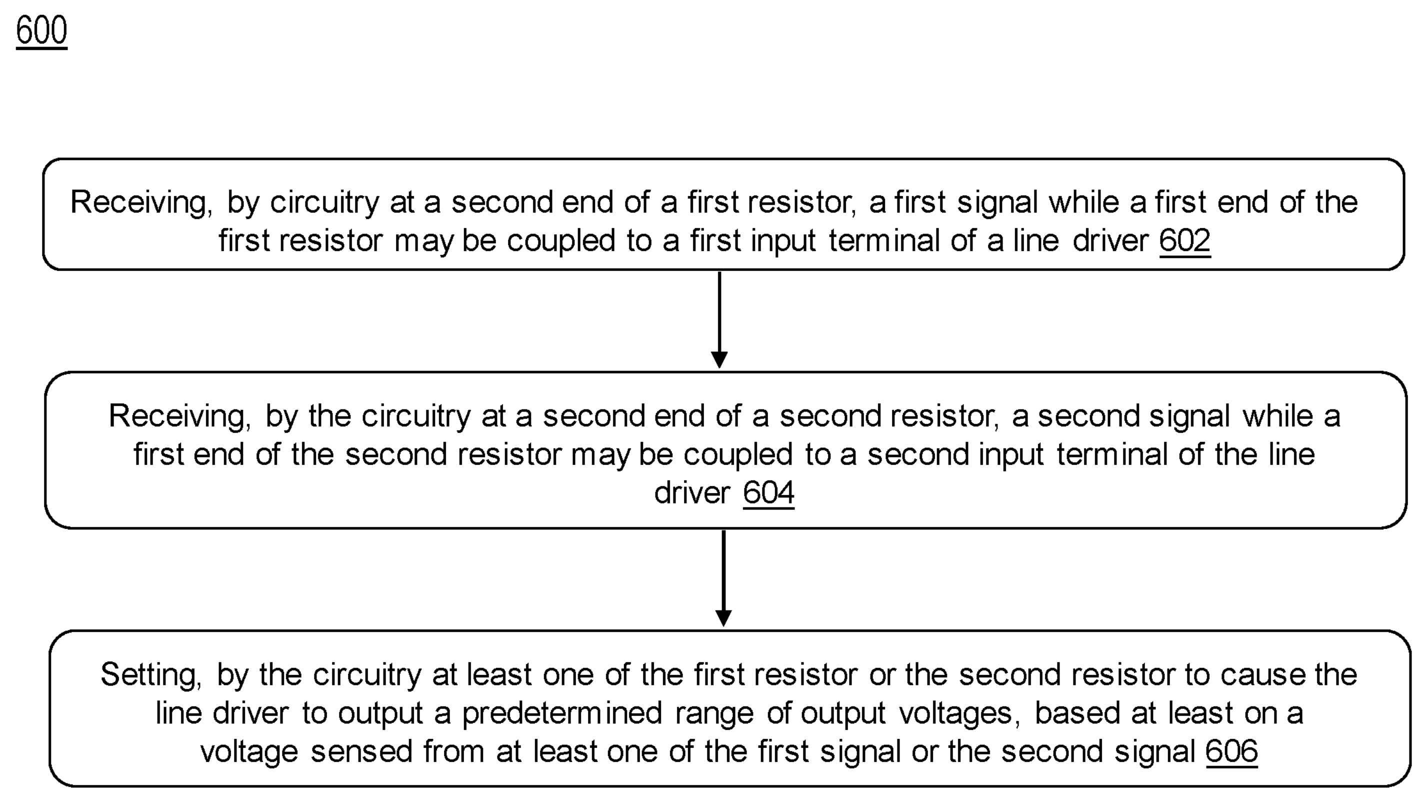
FIG. 6 is a flow diagram showing a process for providing a boost stage of a line driver, in accordance with an embodiment.

FIG. 6 is a flow diagram showing a process 600 for providing a boost stage of a line driver, in accordance with an embodiment. In some embodiments, the process 600 is performed by a system, circuitry, or a line driver (e.g. system 300, 400, 500, auxiliary line driver 360, 460, circuitry of auxiliary line driver including resistors 563, 573 and amplifiers 560, 570). In other embodiments, the process 600 is performed by other entities. In some embodiments, the process 600 includes more, fewer, or different steps than shown in FIG. 6.

At step 602, the circuitry (e.g., circuitry of auxiliary line driver including resistors 563, 573 and amplifiers 560, 570 in FIG. 5A) may receive, at a second end of a first resistor (e.g., left end of first resistor 563), a first signal 562 ($S_1$). A first end of the first resistor (e.g., right end of first resistor 563) may be coupled to a first input terminal 561 ($V_{in+}$) of a line driver (e.g., an auxiliary line driver). In some embodiments, the line driver may include at least one of a class AB line driver or a class B line driver. In some embodiments, the second end of the first resistor (e.g., left end of first resistor 563) may be coupled to a first output terminal of another line driver (e.g., first output terminal $V_{out+}$ of the main line driver 520).

At step 604, the circuitry may receive, at a second end of a second resistor (e.g., left end of second resistor 573), a second signal 572 ($S_2$). A first end of the second resistor (e.g., right end of second resistor 573) may be coupled to a second input terminal 571 ($V_{in+}$) of the auxiliary line driver. The second end of the second resistor (e.g., left end of second resistor 573) may be coupled to a second output terminal of the other line driver (e.g., second output terminal $V_{out-}$ of the main line driver 520).

At step 606, the circuitry may set, at least one of the first resistor 563 or the second resistor 573 to cause the auxiliary line driver to output a predetermined range of output voltages, based at least on a voltage sensed from at least one of the first signal 562 ($S_1$) or the second signal 572 ($S_2$).

In some embodiments, the auxiliary line driver may be one or more electronic amplifiers configured to amplify input voltage signals or current signals, or any circuit that can drive a load such as a transmission line or provide/push more current through a transmission line so as to enable a longer cable length. In some embodiments, the line driver may be a single fully differential amplifier. In some embodiments, the auxiliary line driver may generate a current (e.g., current 565 ($I_{out\_1}$), current 575 ($I_{out\_2}$)), based at least on (1) a voltage sensed from at least the first signal 562 ($S_1$) or the second signal 572 ($S_2$) and (2) at least one of a resistance of the first resistor 563 or a resistance of the second resistor 573, to supply an additional current to at least one of the first signal 562 ($S_1$) or the second signal 572 ($S_2$). In some embodiments, a first end of a third resistor (e.g., right end of termination resistor 532) and a first output terminal of the line driver (e.g., output terminal of the first amplifier 560) may be coupled to an interface (e.g., interface 540) to a physical medium. A first end of a fourth resistor (e.g., right end of termination resistor 531) and a second output terminal of the auxiliary line driver (e.g., output terminal of the second amplifier 570) may be coupled to the interface 540 (e.g., the first terminal 541 of the interface 540). A second end of the fourth resistor (e.g., left end of termination resistor 531) may be coupled to the second end of the first resistor (e.g., left end of first resistor 563). A second end of the third resistor (e.g., left end of termination resistor 532) may be coupled to the second end of the second resistor (e.g., left end of first resistor 573). In some embodiments, each of the third resistor 532 and the fourth resistor 531 may be coupled at an end of a respective transmission line coupled to the interface 540.

The term "coupled" and variations thereof includes the joining of two members directly or indirectly to one another. The term "electrically coupled" and variations thereof includes the joining of two members directly or indirectly to one another through conductive materials (e.g., metal or copper traces). Such joining (for both terms "coupled" and "electrically coupled") may be stationary (e.g., permanent or fixed) or moveable (e.g., removable or releasable). Such joining (for both terms "coupled" and "electrically coupled") may be achieved with the two members coupled directly with or to each other, with the two members coupled with each other using a separate intervening member and any additional intermediate members coupled with one another, or with the two members coupled with each other using an intervening member that is integrally formed as a single unitary body with one of the two members. If "coupled" or variations thereof are modified by an additional term (e.g., directly coupled), the generic definition of "coupled" provided above is modified by the plain language meaning of the additional term (e.g., "directly coupled" means the joining of two members without any separate intervening member), resulting in a narrower definition than the generic definition of "coupled" provided above. Such coupling may be mechanical, electrical, or fluidic.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

It should be noted that certain passages of this disclosure can reference terms such as "first" and "second" in connection with subsets of transmit spatial streams, sounding frames, response, and devices, for purposes of identifying or differentiating one from another or from others. These terms are not intended to merely relate entities (e.g., a first device and a second device) temporally or according to a sequence, although in some cases, these entities can include such a relationship. Nor do these terms limit the number of possible entities that can operate within a system or environment. It should be understood that the systems described above can provide multiple ones of any or each of those components and these components can be provided on either a standalone machine or, in some embodiments, on multiple machines in a distributed system. In addition, the systems and methods described above can be provided as one or more computer-readable programs or executable instructions embodied on or in one or more articles of manufacture, e.g., a floppy disk, a hard disk, a CD-ROM, a flash memory card, a PROM, a RAM, a ROM, or a magnetic tape. The programs can be implemented in any programming language, such as LISP, PERL®, C, C++, C#, or in any byte code language such as JAVA. The software programs or executable instructions can be stored on or in one or more articles of manufacture as object code. In some embodiments, the ADC is employed as an integrated circuit in a transmitter for wireless communication. The ADC is provided on an integrated circuit that includes the calibration engine. The ADC and calibration engine are provided in a single chip or multichip integrated package in some embodiments.

While the foregoing written description of the methods and systems enables one of ordinary skill to make and use embodiments thereof, those of ordinary skill will understand and appreciate the existence of variations, combinations, and equivalents of the specific embodiment, method, and examples herein. The present methods and systems should therefore not be limited by the above described embodiments, methods, and examples, but by all embodiments and methods within the scope and spirit of the disclosure.

What is claimed is:

1. A system comprising:
a first amplifier and a second amplifier, wherein
the first amplifier and a first end of a first resistor are coupled to a first output terminal of a line driver to receive a first signal,
the second amplifier and a first end of a second resistor are coupled to a second output terminal of the line driver to receive a second signal,
a second end of the second resistor and an output terminal of the first amplifier are connected to an interface to a physical medium,
a second end of the first resistor and an output terminal of the second amplifier are connected to the interface,
the first amplifier is configured to convert a voltage sensed from the first signal, into a first amplified current at the second end of the second resistor, and to supply the first amplified current as an additional current to the second signal traversing the second resistor towards the interface, and
the second amplifier is configured to convert a voltage sensed from the second signal, into a second amplified current at the second end of the first resistor, and to supply the second amplified current as an additional current to the first signal traversing the first resistor towards the interface.

2. The system of claim 1, wherein each of the first amplifier and the second amplifier is a transconductance amplifier.

3. The system of claim 1, wherein each of the first amplifier and the second amplifier comprises one or more common-gate transistors in an input stage and one or more common-gate transistors in an output stage.

4. The system of claim 1, wherein each of the first amplifier and the second amplifier comprises a current mirror circuit configured to output a respective current in an output stage.

5. The system of claim 1, wherein at least one of the first amplifier or the second amplifier is a class AB amplifier.

6. The system of claim 1, wherein each of the first resistor and the second resistor is coupled at an end of a respective transmission line coupled to the interface.

7. A system comprising:
a first amplifier and a first resistor coupled to an input terminal of the first amplifier; and a second amplifier and a second resistor coupled to an input terminal of the second amplifier, wherein
a first end of the first resistor is coupled to a first output terminal of a line driver to receive a first signal, wherein the first resistor is configured to convert a first input voltage of the first signal into a first input current of the first amplifier, a first end of the second resistor is coupled to a second output terminal of the line driver to receive a second signal, wherein the second resistor is configured to convert a second input voltage of the second signal into a second input current of the second amplifier, an output terminal of the second amplifier is coupled to a first terminal of an interface to a physical medium, an output terminal of the first amplifier is coupled to a second terminal of the interface, the first amplifier is configured to amplify the first input current and generate a first amplified current, and to supply the first current as an additional current to the second signal flowing towards the interface, and the second amplifier is configured to amplify the second input current and generate a second amplified current, and to supply the second amplified current as an additional current to the second signal flowing towards the interface.

8. The system of claim 7, wherein resistance of at least one of the first resistor or the second resistor is set such that the first amplifier and the second amplifier output a particular range of output voltages based at least on a voltage sensed from at least one of the first signal or the second signal.

9. The system of claim 7, wherein each of the first amplifier and the second amplifier is a transconductance amplifier.

10. The system of claim 7, wherein each of the first amplifier and the second amplifier comprises one or more common-gate transistors in an input stage and one or more common-gate transistors in an output stage.

11. The system of claim 7, wherein each of the first amplifier and the second amplifier comprises a current mirror circuit configured to output a respective current in an output stage.

12. The system of claim 7, wherein at least one of the first amplifier or the second amplifier is a class AB amplifier.

13. The system of claim 7, wherein a first end of a third resistor is coupled to the first output terminal of the line driver, a first end of a fourth resistor is coupled to the second output terminal of the line driver, a second end of the fourth resistor and the output terminal of the first amplifier are coupled to the interface, and a second end of the third resistor and the output terminal of the second amplifier are coupled to the interface.

14. The system of claim 13, wherein each of the third resistor and the fourth resistor is coupled at an end of a respective transmission line coupled to the interface.

15. A system comprising:

circuitry configured to couple a first end of a first resistor to a first input terminal of a line driver, and couple a first end of a second resistor to a second input terminal of the line driver, wherein the circuitry is configured to receive, at a second end of the first resistor, a first signal, wherein the first resistor is a programmable or variable resistor, receive, at a second end of the second resistor, a second signal, wherein the second resistor is a programmable or variable resistor, and set resistance of at least one of the first resistor or the second resistor such that the line driver outputs a predetermined range of output voltages based at least on a voltage sensed from at least one of the first signal or the second signal, wherein the first resistor is configured to convert a first input voltage of the first signal into a first input current, wherein the second resistor is configured to convert a second input voltage of the second signal into a second input current, wherein the line driver is configured to:

amplify the first input current and generate a first amplified current, and to supply the first amplified current as an additional current to the second signal, and amplify the second input current and generate a second amplified current, and to supply the second amplified current as an additional current to the first signal.

16. The system of claim 15, wherein the line driver includes at least one of a class AB line driver or a class B line driver.

17. The system of claim 15, wherein the second end of the first resistor is coupled to a first output terminal of another line driver, and the second end of the second resistor is coupled to a second output terminal of the another line driver.

18. The system of claim 15, wherein a first end of a third resistor and a first output terminal of the line driver are coupled to an interface to a physical medium, a first end of a fourth resistor and a second output terminal of the line driver are coupled to the interface, a second end of the fourth resistor is coupled to the second end of the first resistor, and a second end of the third resistor is coupled to the second end of the second resistor.

19. The system of claim 18, wherein each of the third resistor and the fourth resistor is coupled at an end of a respective transmission line coupled to the interface.

* * * * *